(12) United States Patent
Hamada et al.

(10) Patent No.: US 8,151,455 B2
(45) Date of Patent: Apr. 10, 2012

(54) PRINTED CIRCUIT BOARD AND METHOD OF MANUFACTURING THE SAME

(75) Inventors: Kazunori Hamada, Ebina (JP); Hiroshi Kawasaki, Ebina (JP); Tomoaki Ozaki, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 964 days.

(21) Appl. No.: 12/143,214

(22) Filed: Jun. 20, 2008

(65) Prior Publication Data
US 2008/0314625 A1 Dec. 25, 2008

(30) Foreign Application Priority Data

Jun. 22, 2007 (JP) ................................. 2007-164463

(51) Int. Cl.
*H05K 3/02* (2006.01)
(52) U.S. Cl. .......................................... 29/847; 29/853
(58) Field of Classification Search ................ 29/847, 29/852–853
See application file for complete search history.

(56) References Cited

U.S. PATENT DOCUMENTS

| 2006/0090933 | A1* | 5/2006 | Wig et al. | 174/262 |
| 2006/0243481 | A1* | 11/2006 | Bachar et al. | 174/262 |
| 2006/0278429 | A1* | 12/2006 | Tourne et al. | 174/266 |
| 2008/0217052 | A1* | 9/2008 | Matsui | 174/266 |

FOREIGN PATENT DOCUMENTS

| JP | 2005-116945 A | 4/2005 |
| JP | 2006-173146 A | 6/2006 |

* cited by examiner

*Primary Examiner* — Jeremy Norris
(74) *Attorney, Agent, or Firm* — Crowell & Moring LLP

(57) ABSTRACT

A method of manufacturing a printed circuit board is provided. The method includes preliminarily forming a plurality of test pattern layers for detecting the depth of an inner layer in a multilayer printed circuit board such that at least a part of a lower test pattern layer is not overlaid with any upper test pattern layer when viewed from a drill entrance side, and preliminarily forming a surface conductor layer; applying a voltage between the surface conductor layer and the test pattern layers; performing drilling toward one test pattern layer, and detecting a current produced when the drill comes into contact with the test pattern to measure the depth of the layer (D1); performing drilling toward the other test pattern layer, and measuring the depth of the layer (D2); and performing drilling up to just before the conductor-wiring layer based on a depth calculated from D1 and D2.

7 Claims, 6 Drawing Sheets

PRINTED CIRCUIT BOARD AND METHOD OF MANUFACTURING THE SAME

BACKGROUND OF THE INVENTION

The present invention relates to a method of manufacturing a printed circuit board for improving signal delay and impedance mismatching, and a printed circuit board suitable for the method of manufacturing the same. More particularly, the present invention relates to a method of shortening a stub of the printed circuit board.

In order to mount an electronic component, such as a LSI (large-scale integrated circuit), to a multilayer printed circuit board, a through-hole is formed and conductive plating is applied to the through-hole, to provide a terminal for connecting with a predetermined inner conductor-wiring layer. However, since a plated portion of the through-hole is longer than the distance to the target conductor-wiring layer, there arise problems in impedance mismatching, signal delay, and waveform distortion unless the overlong portion (hereinafter referred to as stub) is shortened.

Therefore, it is necessary to perform drilling (hereinafter referred to as back-drilling) from the back side up to just before the conductor-wiring layer to remove the stub of plating by use of a drill having a diameter slightly larger than that of the through-hole. There is an increasing need for this process with an increase of high-frequency printed circuit boards in recent years.

In the processing, controlling the depth of back-drilling has a problem. A printed circuit board is generally formed by compressing with heat resin layers and conductive wiring layers stacked alternately, which may cause a variation in the thickness of each layer and board, which results in a depth variation ranging from 60 to 100 μm of the position of the conductive wiring layer.

To cope with the above problem, the following method is devised. A detecting portion of a detection pattern is formed just before the target conductor-wiring layer and a voltage is applied between the detection pattern and a drill for back-drilling. Thereby a current flows when the drill comes in contact with the detecting portion, then the back-drilling is terminated. (for example, refer to JP-A-2006-173146 (FIG. 1, Detecting portion 35) or JP-A-2005-116945 (FIG. 7, Current detection layer 16-1))

However, with the above-mentioned conventional method of using detecting portions, a detection pattern becomes complicated and, accordingly, the number of layers increases, which may result in an increase in the material cost in some cases. Further, there may be a hole around which a detecting portion cannot be formed at all.

SUMMARY OF THE INVENTION

In order to solve the above-mentioned problem, the present invention provides a method of manufacturing a printed circuit board, for forming a through-hole for connecting a predetermined conductor-wiring layer of a multilayer printed circuit board having a plurality of conductor layers and insulating layers, applying conductive plating to the through-hole, and removing an overlong plated portion by drilling up to the vicinity of the conductor-wiring layer. The method comprising the steps of: preliminarily forming a plurality of test pattern layers for detecting the depth of an inner layer in the multilayer printed circuit board such that at least a part of a lower test pattern layer is not overlaid with any upper test pattern layer when viewed from a drill entrance side, and a surface conductor layer such that all the test pattern layers are overlaid with it; applying a voltage to two selected test pattern layers in the vicinity of a region subjected to the drilling, such that the depths of the two selected test pattern layers are near the depth of the conductor-wiring layer; performing drilling toward one of the selected test pattern layers by use of a drill for the drilling, and detecting a current produced when the drill comes into contact with the relevant test pattern to measure the depth of the layer (D1); performing drilling toward the other test pattern layer by use of the drill, and detecting a current produced when the drill comes into contact with the relevant test pattern to measure the depth of the layer (D2); and performing the drilling by use of the drill up to just before the conductor-wiring layer with reference to a depth calculated from the D1 and D2.

Further, the present invention provides a multilayer printed circuit board having a plurality of conductor layers and insulating layers, wherein a plurality of test pattern layers for detecting the depth of an inner layer in the multilayer printed circuit board are preliminarily formed such that at least a part of a lower test pattern layer is not overlaid with any upper test pattern layer when viewed from a drill entrance side, and a surface conductor layer is preliminarily formed such that all the test pattern layers are overlaid with it.

As explained above, in accordance with the present invention, it is possible to perform high-precision back-drilling by use of a simple test pattern.

BRIEF DESCRIPTION OF THE INVENTION

DETAILED DESCRIPTION OF THE INVENTION

A method of manufacturing a printed circuit board according to the present invention and an embodiment of the printed circuit board will be explained below with reference to the accompanying drawings.

Figure 1:
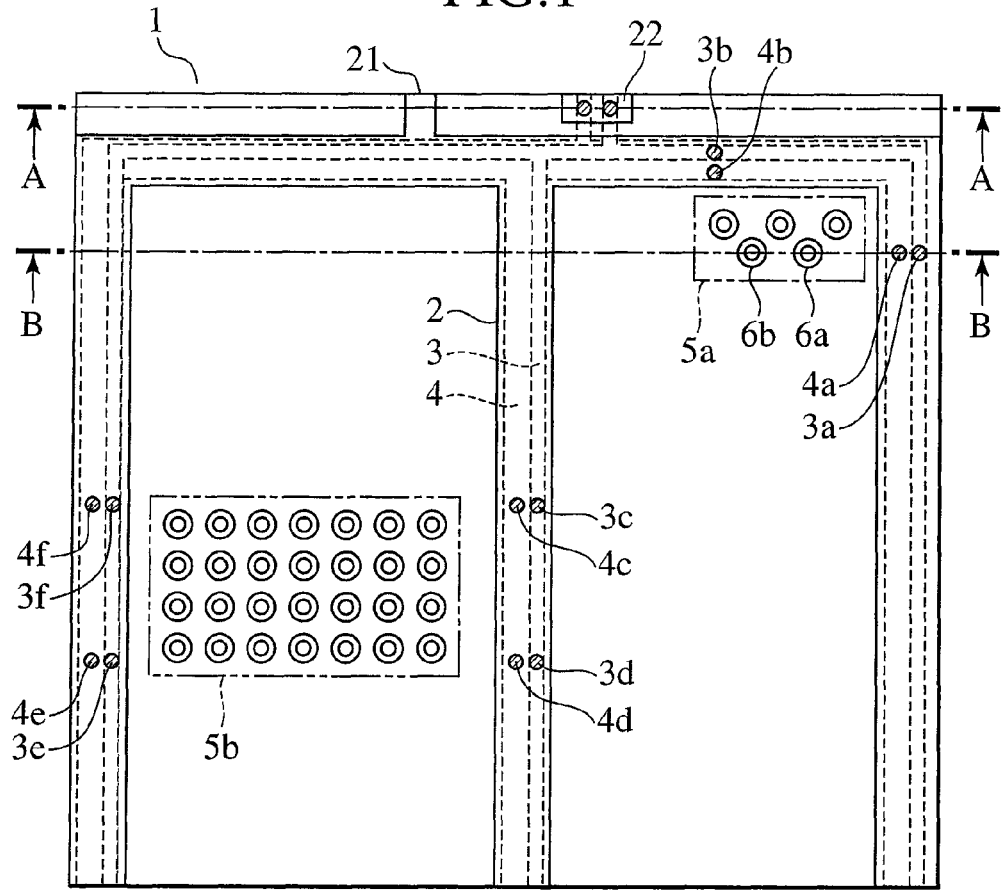
FIG. 1 is a plan view showing an example of a printed circuit board suitable for a method of manufacturing the same according to the present invention.
Figure 2:
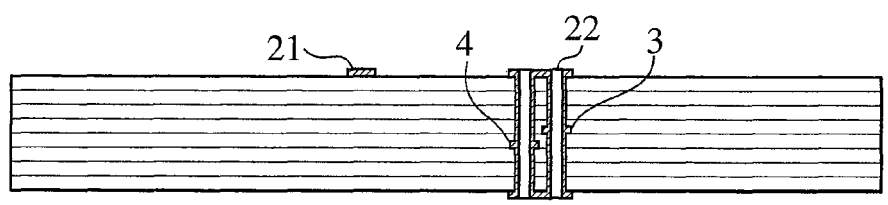
FIG. 2 is a cross-sectional view taken along the A-A line of FIG. 1.
Figure 3:
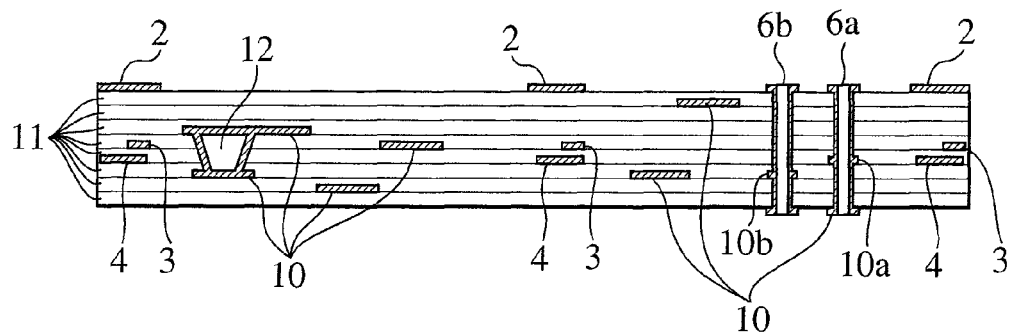
FIG. 3 is a cross-sectional view taken along the B-B line of FIG. 1.

FIG. 1 is a plan view showing an example of a printed circuit board suitable for a method of manufacturing the same according to the present invention, FIG. 2 is a cross-sectional view taken along the A-A line of FIG. 1, and FIG. 3 is a cross-sectional view taken along the B-B line of FIG. 1. A printed circuit board 1 has conductor-wiring layers 10 which are separated by insulating layers 11 and connected by a plated inner layer via-hole 12 or the like. Terminals 6a, 6b, etc. for connecting electronic components, etc. are concentrated in one part on the printed circuit board 1 to form back-drilling portions 5a and 5b. In the printed circuit board according to the present invention, two test pattern layers 3 and 4 are formed such that at least a part of the test pattern layer 4 is not overlaid with the test pattern layer 3, and disposed in the vicinity of the back-drilling portions 5a and 5b, near the depth of a target inner conductor-wiring layer. A surface conductor layer 2 is formed such that both test pattern layers 3 and 4 are overlaid with it. In this example, a part of the surface conductor layer 2 is pulled out as a surface conductor layer electrode 21, and a part of each of the test pattern layers 3 and 4 is pulled out below the test pattern layer electrode 22 and then connected with a plated through-hole. A power source (not shown) is connected between the surface conductor layer electrode 21 and the test pattern layer electrode 22, and a voltage (about 5V) is applied therebetween. When conduction occurs between the surface conductor layer 2 and one of the test pattern layers 3 and 4 by a drill, a current flows therebetween and is detected by a detector (not shown), thus recognizing that the drill has reached the relevant test pattern layer. Points 3a to 3f and 4a to 4f are used to measure the depths of respective test pattern layers (hereinafter referred to as depth measuring points).

Back-drilling related to the method of manufacturing the printed circuit board according to the present invention will be explained below with reference to the terminals 6a and 6b of the back-drilling portion 5a. FIGS. 4 to 8 are enlarged fragmentary sectional views of the relevant portions, each sequentially showing the progress of back-drilling process in this order.

Figure 4:
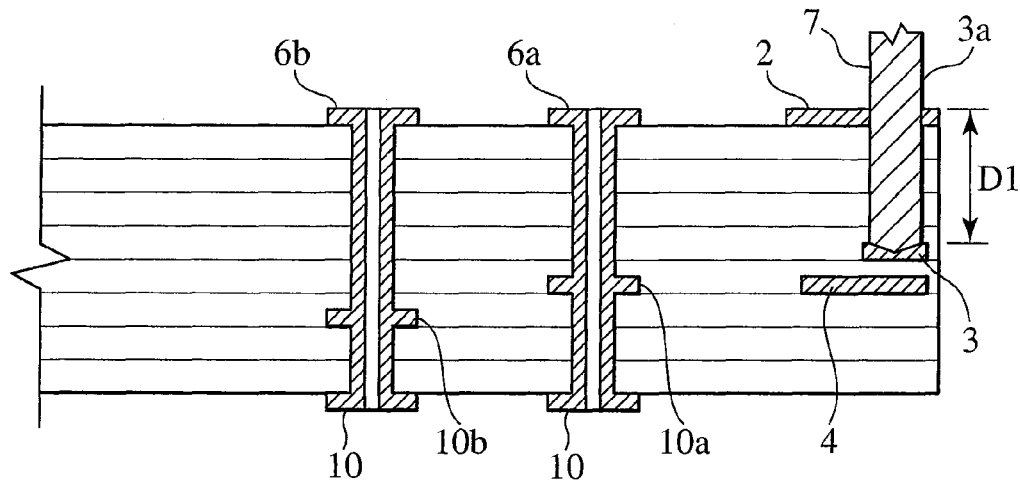
FIG. 4 is an enlarged fragmentary sectional view showing a first process of the method of manufacturing a printed circuit board according to the present invention.

First, drilling is performed to the depth measuring point 3a by use of a drill 7 for back-drilling, and then the depth of the test pattern layer 3 (D1) is measured (refer to FIG. 4).

Figure 5:
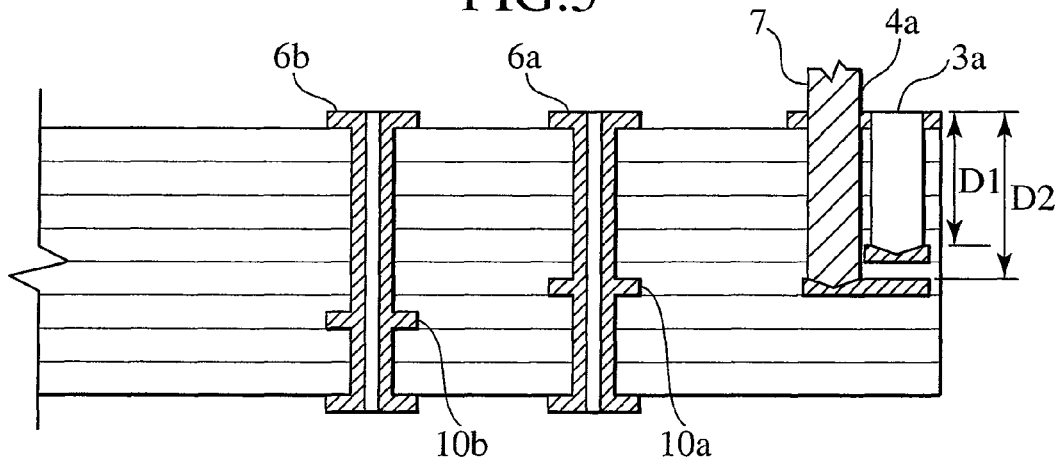
FIG. 5 is an enlarged fragmentary sectional view showing a second process of the method of manufacturing a printed circuit board according to the present invention.

Then, drilling is performed to the depth measuring point 4a by use of the drill 7, and then the depth of the test pattern layer 4 (D2) is measured (refer to FIG. 5).

Subsequently, the same measurements are performed also for other measuring points 3b and 4b shown in FIG. 1, and the obtained depths of the test pattern layers are averaged to calculate an intermediate depth of the test pattern layers 3 and 4. Here, a weighted average may be used for the calculation.

Figure 6:
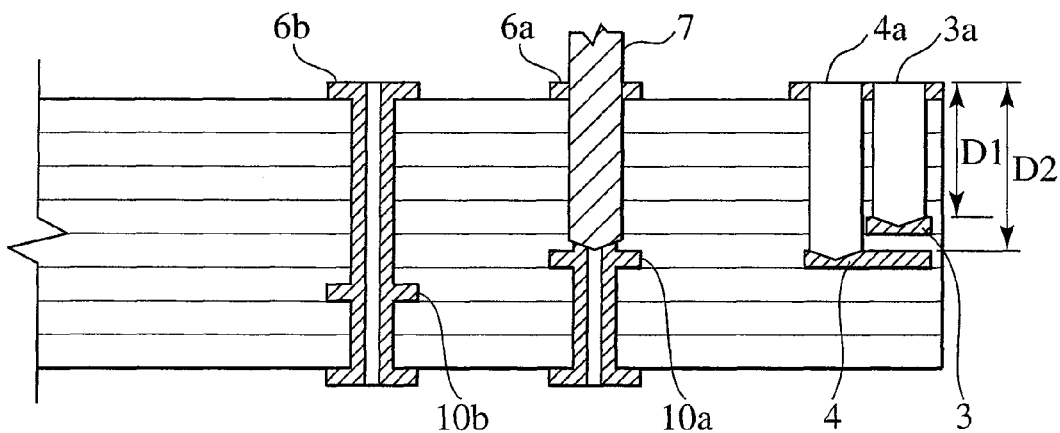
FIG. 6 is an enlarged fragmentary sectional view showing a third process of the method of manufacturing a printed circuit board according to the present invention.

Then, using the calculated intermediate depth of the test pattern layers 3 and 4 as a standard, the depth of a target conductor-wiring layer 10a for the terminal 6a is calculated (estimated), and the drilling depth of the drill 7 is determined to perform drilling, thus removing a plated layer (refer to FIG. 6).

Figure 7:
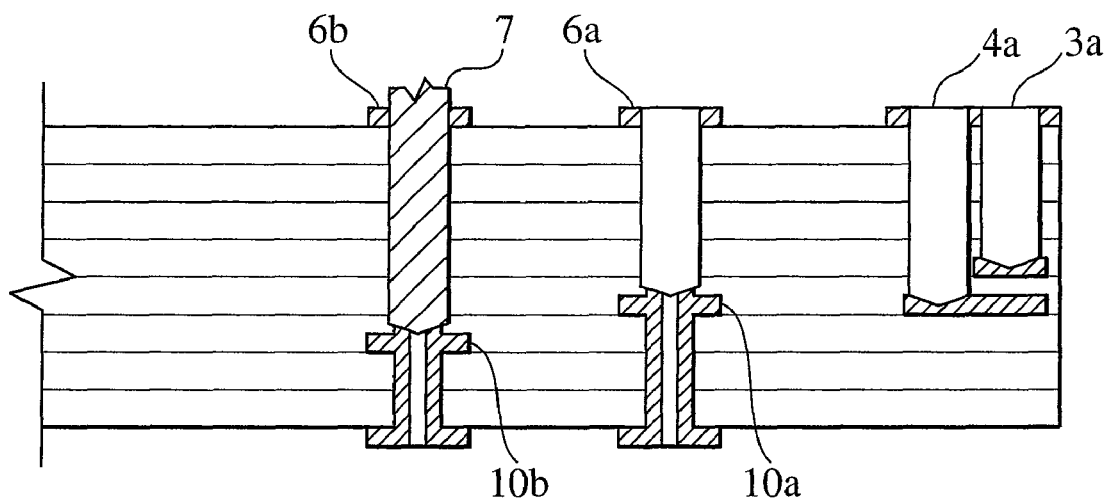
FIG. 7 is an enlarged fragmentary sectional view showing a fourth process of the method of manufacturing a printed circuit board according to the present invention.

Similarly, the depth of a target conductor-wiring layer 10b for the terminal 6b is calculated (estimated) by adding a likely thickness of a layer, the drilling depth of the drill 7 is determined to perform drilling, thus removing a plated layer (refer to FIG. 7).

Figure 8:
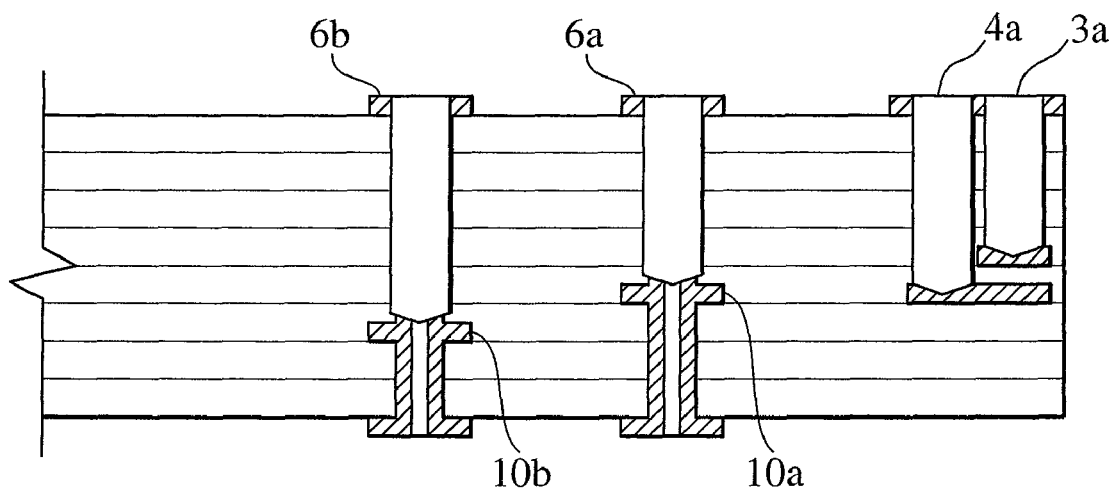
FIG. 8 is an enlarged fragmentary sectional view showing a status where the method of manufacturing a printed circuit board according to the present invention is completed.

FIG. 8 shows a state where back-drilling for the terminals 6a and 6b is completed. In this example, the measuring points 3a and 4a are arranged in line with the terminals 6a and 6b for the convenience of explanation; however, they are not necessarily be in line as long as the measuring points 3a and 4a are formed above the test pattern layers 3 and 4, respectively.

Further, if the drilling portion is large like a back-drilling portion 5b, it is possible to prevent degradation of the depth measurement accuracy by providing four measuring points for each test pattern, for example, measuring points 3c to 3f and 4c to 4f.

First Embodiment

FIG. 1 is a plan view showing an example of a printed circuit board suitable for a method of manufacturing the same according to the present invention, FIG. 2 is a cross-sectional view taken along the A-A line of FIG. 1, and FIG. 3 is a cross-sectional view taken along the B-B line of FIG. 1. Explanations of FIGS. 1 to 3 will be omitted because they have already been explained earlier. With the printed circuit board 1 according to the present embodiment, the test pattern layer 4 having a large width is formed immediately below the test pattern layer 3, and both pattern layers are formed in the vicinity of the back-drilling portions 5a and 5b, and disposed near the depth of a target inner conductor-wiring layer. A surface conductor layer 2 is formed such that both test pattern layers 3 and 4 are overlaid with it.

Since the test pattern layers 3 and 4 can be formed simultaneously with corresponding conductor-wiring layers 10 in a manufacturing process of an ordinary printed circuit board, there is no difficulty in the manufacturing method. Further, the test pattern layers 3 and 4 can be used also as a common electrode or a ground after completion of the printed circuit board because it is only necessary that the test pattern layers 3 and 4 are electrically insulated from the surface conductor layer 2.

Second Embodiment

Figure 9:
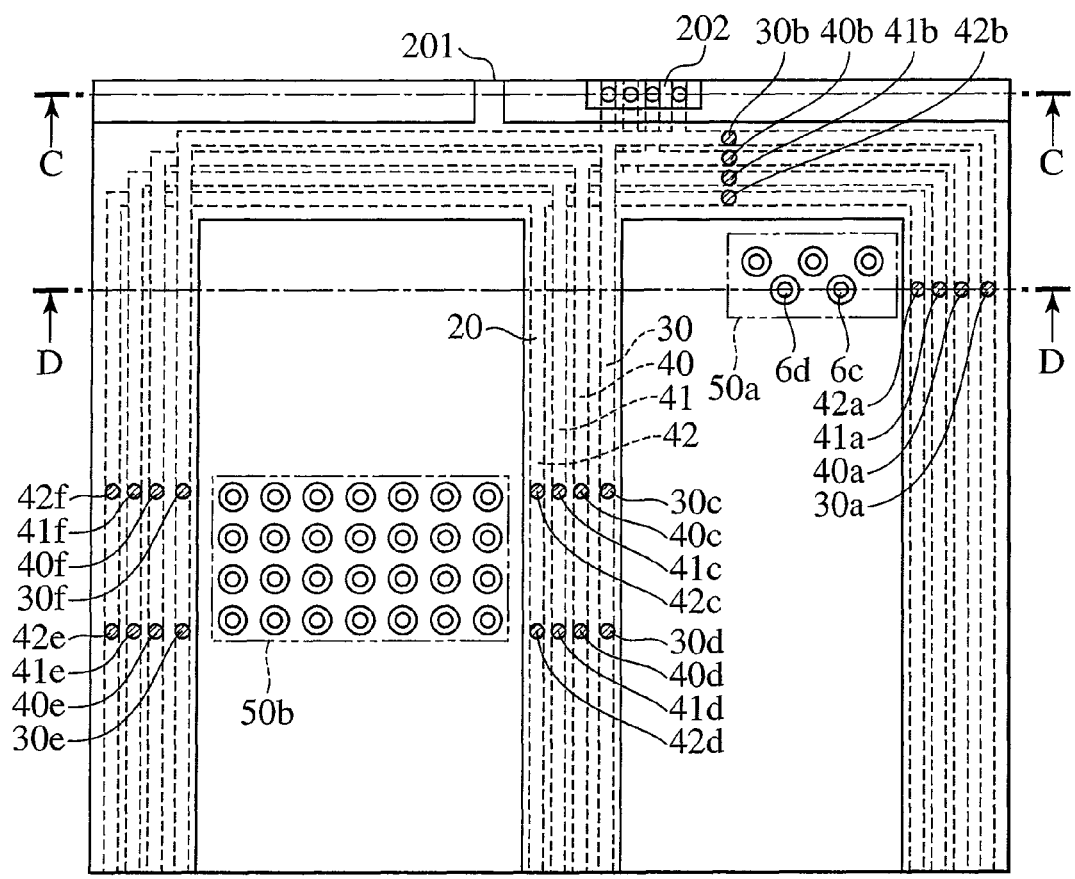
FIG. 9 is a plan view showing a second embodiment of a printed circuit board suitable for the method of manufacturing the same according to the present invention.
Figure 10:
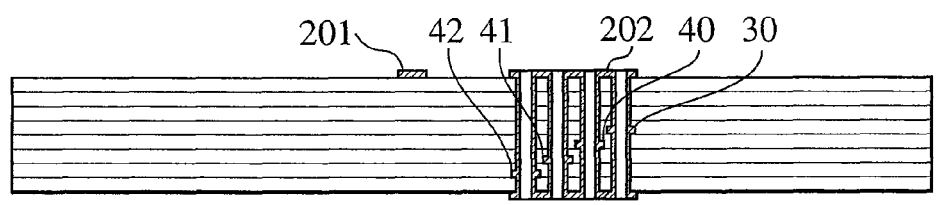
FIG. 10 is a sectional view taken along the C-C line of FIG. 9.
Figure 11:
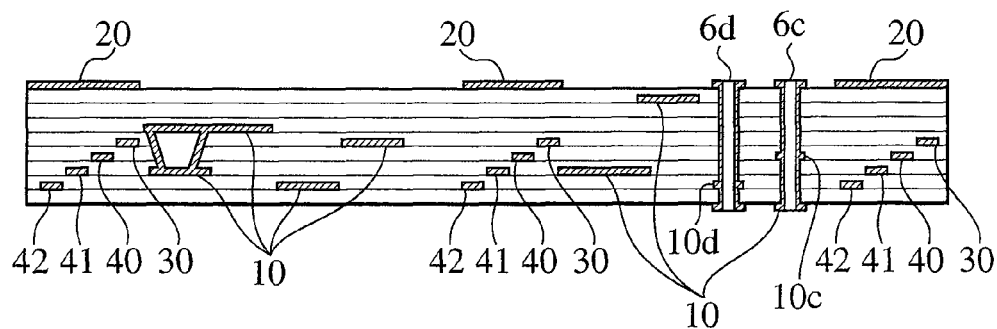
FIG. 11 is a sectional view taken along the D-D line of FIG. 9.

FIG. 9 is a plan view showing a second embodiment of a printed circuit board suitable for the method of manufacturing the same according to the present invention, FIG. 10 is a sectional view taken along the C-C line of FIG. 9, and FIG. 11 is a sectional view taken along the D-D line of FIG. 9. In the present embodiment, four test pattern layers 30, 40, 41, and 42 are formed such that at least a part of a lower test pattern layer is not overlaid with any upper test pattern layer, in the vicinity of the back-drilling portions 5a and 5b, where the test pattern layers do not overlay one another at all in this embodiment, and disposed near the depth of a target inner conductor-wiring layer. A surface conductor layer 20 is formed such that all the test pattern layers 30, 40, 41, and 42 are overlaid with it. In the present embodiment, a part of surface conductor layer 20 is pulled out as a surface conductor layer electrode 201, and a part of each of the test pattern layers 30, 40, 41, and 42 is pulled out below the test pattern layer electrode 202 and then connected with a plated through-hole. A power source (not shown) is connected between the surface conductor layer electrode 201 and the test pattern layer electrode 202, and a voltage (about 5V) is applied therebetween. When conduction occurs between the surface conductor layer 20 and one of the test pattern layers 30, 40, 41, and 42 by drilling, a current flows therebetween and is detected by a detector (not shown), thus recognizing that the drill has reached the relevant test pattern layer. Here, points 30a to 30f, 40a to 40f, 41a to 41f, and 42a to 42f are used to measure the depths of respective test pattern layers.

The present embodiment is effective when target conductor-wiring layers 10c and 10d for terminals 6c and 6d, respectively, of a back-drilling portion 50a are separated from each other by two insulating layers. That is, it is preferable to perform back-drilling of the terminal 6c regarding the conductor-wiring layer 10c as a target based on a depth standard measured using the test pattern layers 30 and 40, and back-drilling of the terminal 6d regarding the conductor-wiring layer 10d as a target based on a depth standard measured using the test pattern layers 41 and 42. This makes it possible to prevent degradation of the depth accuracy in a case where a target conductor layer is far from a depth standard.

Although four test pattern layers are used in the present embodiment, only three test pattern layers 30, 40, and 41 may be used if there is not a large difference in depth of the target conductor-wiring layers. In this case, it is possible to obtain a depth standard by use of the test pattern layers 30 and 40, and another depth standard by use of the test pattern layers 40 and 41.

Further, unlike the first embodiment, the present embodiment uses the test pattern layers 30, 40, 41, and 42 that do not overlay one another when viewed from the top (the back) and the bottom (the front). In this case, however, if a surface conductor layer, a surface conductor layer electrode, and a test pattern electrode are formed also on the front side, it is possible to perform back-drilling of the same board not only from the back side but also from the front side.

Further, when back-drillings of test pattern layers 30 and 40 are performed from the back side and the test pattern layer 41 and 42 from the front side, it is not necessary to make arrangements such that the test pattern layers 30, 40, 41, and 42 do not overlay one another. It is only necessary to make arrangements such that a part of the test pattern layer 40 is not overlaid with the test pattern layer 30 when viewed from the back side and a part of the test pattern layer 41 is not overlaid with the test pattern layer 42 when viewed from the front side.

Third Embodiment

Figure 12:
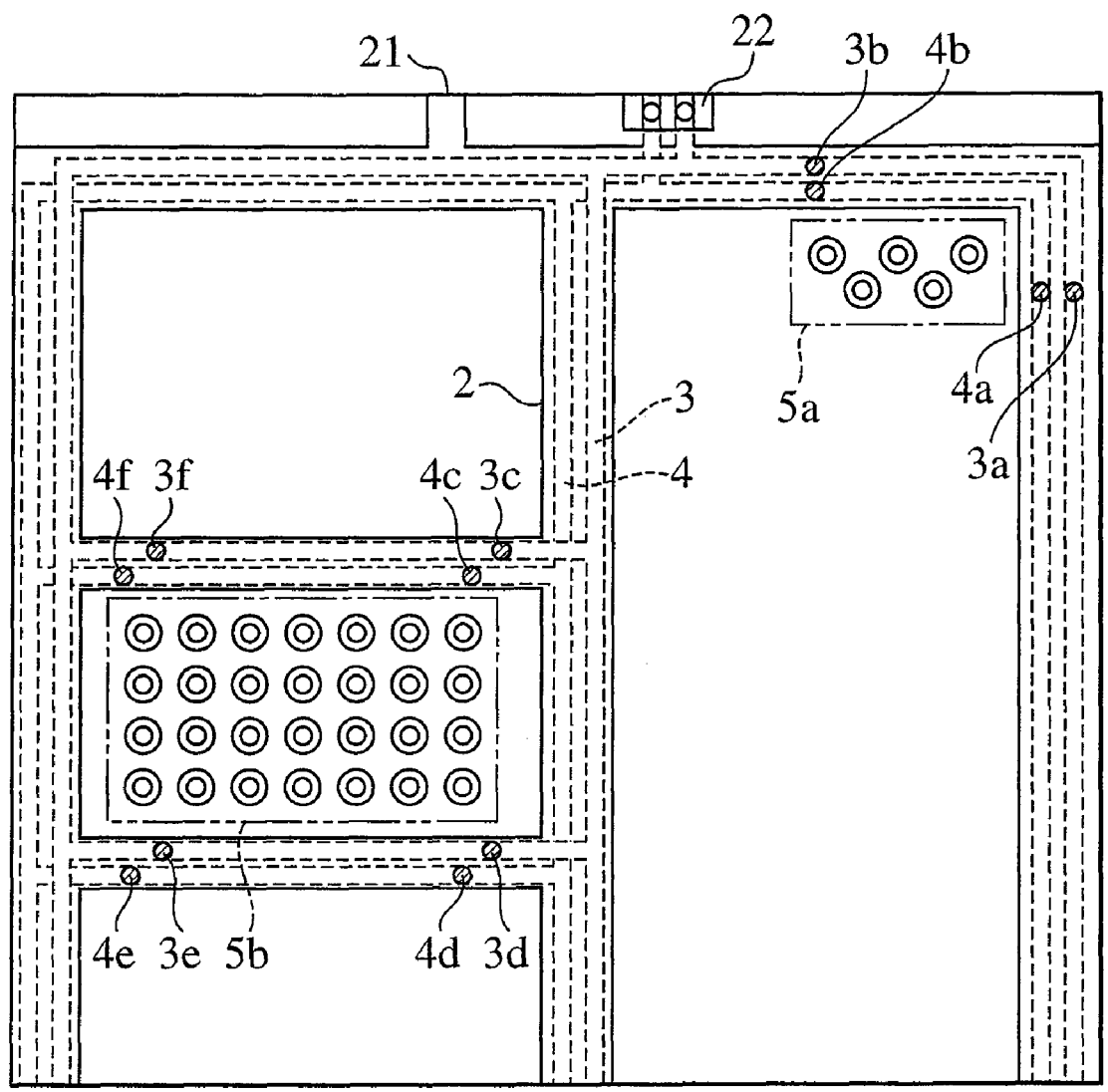
FIG. 12 is a plan view showing a third embodiment of a printed circuit board suitable for the method of manufacturing the same according to the present invention.

FIG. 12 is a plan view showing a third embodiment of a printed circuit board suitable for the method of manufacturing the same according to the present invention. Portions of FIG. 12 assigned the same reference numeral as FIG. 1 are the same as those of FIG. 1 and therefore explanations thereof will be omitted. In the present embodiment, a surface conductor layer 2 and test pattern layers 3 and 4 are arranged so as to surround a large back-drilling portion 5b. As seen from FIG. 12, this configuration makes it easy to arrange measuring points 3c to 3f and 4c to 4f nearer to the back-drilling portion 5b.

Fourth Embodiment

Figure 13:
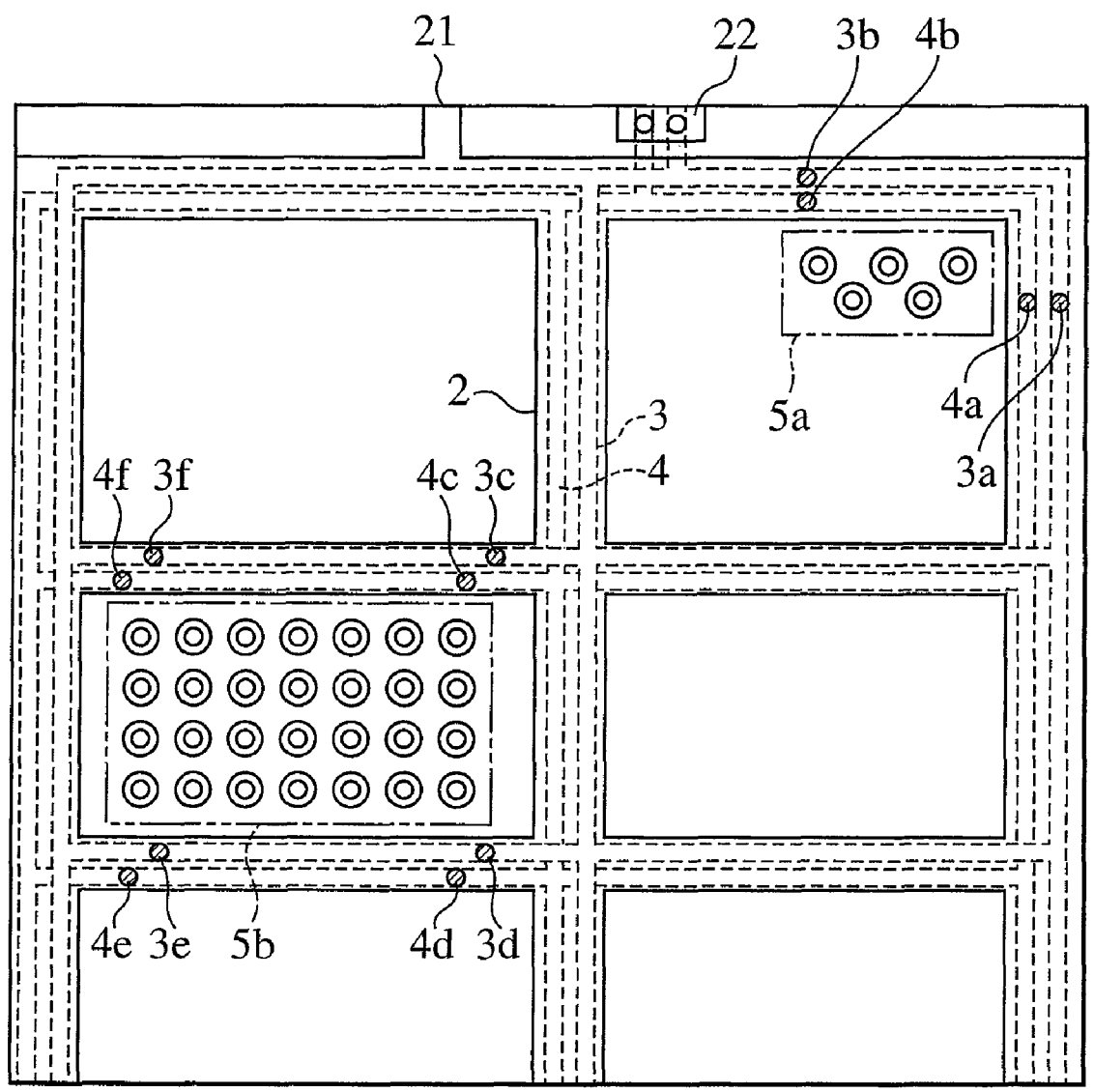
FIG. 13 is a plan view showing a fourth embodiment of a printed circuit board suitable for the method of manufacturing the same according to the present invention.

FIG. 13 is a plan view showing a fourth embodiment of a printed circuit board suitable for the method of manufacturing the same according to the present invention. Portions of FIG. 13 assigned the same reference numeral as FIG. 1 are the same as those of FIG. 1 and therefore explanations thereof will be omitted. In the present embodiment, a surface conductor layer 2 and test pattern layers 3 and 4 are arranged so as to surround a large back-drilling portion 5b and in a lattice pattern. As seen from FIG. 13, this configuration makes it easy to arrange measuring points 3c to 3f and 4c to 4f nearer to the back-drilling portion 5b.

The invention claimed is:

1. A method of manufacturing a printed circuit board for forming a through-hole for connecting a predetermined conductor-wiring layer of a multilayer printed circuit board having a plurality of conductor layers and insulating layers, applying conductive plating to the through-hole, and removing an overlong plated portion by drilling up to the vicinity of the conductor-wiring layer, the method comprising the steps of:
   preliminarily forming a plurality of test pattern layers for detecting the depth of an inner layer in the multilayer printed circuit board such that at least a part of a lower test pattern layer is not overlaid with any upper test pattern layer when viewed from a drill entrance side, and a surface conductor layer such that all the test pattern layers are overlaid with it;
   applying a voltage to two selected test pattern layers in the vicinity of a region subjected to the drilling, the depths of the two test pattern layers being near the depth of the conductor-wiring layer;
   performing a first drilling toward one of the selected test pattern layers by use of a drill for the drilling, and detecting a current produced when the drill comes into contact with the relevant test pattern to measure the depth of the layer (D1);
   performing a second drilling toward the other test pattern layer by use of the drill, and detecting a current produced when the drill comes into contact with the relevant test pattern to measure the depth of the layer (D2); and
   performing a third drilling by use of the drill up to just before the conductor-wiring layer based on a depth calculated from the D1 and D2.

2. The method of manufacturing a printed circuit board according to claim 1,
   wherein the depth calculated from the D1 and D2 is an average of the D1 and D2.

3. The method of manufacturing a printed circuit board according to claim 1,
   wherein the plurality of test pattern layers are all of the plurality of test pattern layers.

4. The method of manufacturing a printed circuit board according to claim 1,
   wherein the first drilling is performed at a different lateral position than the third drilling.

5. The method of manufacturing a printed circuit board according to claim 1,
   wherein the second drilling is performed at a different lateral position than the third drilling.

6. The method of manufacturing a printed circuit board according to claim 1,
   wherein the first drilling is performed at a different lateral position than the second drilling.

7. The method of manufacturing a printed circuit board according to claim 1,
   wherein the first, second, and third drillings are performed at different lateral positions.

* * * * *